(12) United States Patent
Ikuta (10) Patent No.: US 8,052,797 B2
(45) Date of Patent: Nov. 8, 2011

(54) METHOD FOR REMOVING FOREIGN MATTER FROM SUBSTRATE SURFACE

(75) Inventor: Yoshiaki Ikuta, Schenectady, NY (US)

(73) Assignee: Asahi Glass Company, Limited, Tokyo (JP)

( * ) Notice: Subject to any disclaimer, the term of this patent is extended or adjusted under 35 U.S.C. 154(b) by 905 days.

(21) Appl. No.: 11/552,269

(22) Filed: Oct. 24, 2006

(65) Prior Publication Data

US 2008/0092918 A1     Apr. 24, 2008

(51) Int. Cl.
   *B08B 3/04*   (2006.01)
   *B08B 3/08*   (2006.01)
(52) U.S. Cl. ......... 134/1; 134/1.3; 134/2; 134/3; 134/26
(58) Field of Classification Search ............... 134/1, 1.3, 134/2, 3, 26, 42
   See application file for complete search history.

(56) References Cited

U.S. PATENT DOCUMENTS

| | | | |
|---|---|---|---|
| 5,221,423 A * | 6/1993 | Sugino et al. | 438/704 |
| 5,814,156 A | 9/1998 | Elliott et al. | |
| 6,217,665 B1 * | 4/2001 | Suzuki | 134/1 |
| 6,296,714 B1 * | 10/2001 | Matsuo et al. | 134/2 |
| 2004/0035153 A1 * | 2/2004 | Koike et al. | 65/61 |
| 2004/0209194 A1 | 10/2004 | Kume et al. | |
| 2005/0229946 A1 * | 10/2005 | Hirae et al. | 134/1 |

FOREIGN PATENT DOCUMENTS

| | | |
|---|---|---|
| EP | 0 859 404 A2 | 8/1998 |
| JP | 3-120719 | 5/1991 |
| JP | 2002-131889 | 5/2002 |
| JP | 2003-71399 | 3/2003 |

OTHER PUBLICATIONS

Kenji Masui, et al., "Ultra-fine Mask Cleaning Technology using Ultra-violet Irradiation", SPIE, vol. 3412, Apr. 1998, pp. 447-454.
Jun-Fei Zheng, et al., "Impact of surface contamination on transmittance of modified fused silica for 157-nm lithography application", SPIE, vol. 4186, 2001, pp. 767-773.
Hiroshi Sugawara, et al., "Photocleaning employing dielectric barrier discharge excimer lamp", Summary of the Meeting for the Society of Chemical Engineers SD2-15, 1996, 4 Pages.
Shinichi Iso, et al., "Study of UV/O3 Cleaning Employing Xe2 Excimer Lamp", Journal of the Illuminating Engineering Institute of Japan, vol. 83, No. 5, 1999, pp. 1-8.

* cited by examiner

*Primary Examiner* — Michael Kornakov
*Assistant Examiner* — Natasha Campbell
(74) *Attorney, Agent, or Firm* — Oblon, Spivak, McClelland, Maier & Neustadt, L.L.P.

(57) ABSTRACT

A method for removing inorganic foreign matters from the surface of a substrate made of silicon or glass or the surface of an inorganic coating formed on the surface of the substrate, which includes applying a light beam in a wavelength range which makes the light absorption coefficient of at least one of a material of the substrate, a material of the inorganic coating and the inorganic foreign matters be at least 0.01/cm, to the surface of the substrate or to the surface of the inorganic coating in an application amount of at least 10 J/cm$^2$ in an oxygen- or ozone-containing atmosphere, and exposing the surface of the substrate or the surface of the inorganic coating having a negative surface potential to an acidic solution having a pH $\leq 6$.

19 Claims, 5 Drawing Sheets

METHOD FOR REMOVING FOREIGN MATTER FROM SUBSTRATE SURFACE

BACKGROUND OF THE INVENTION

1. Field of the Invention

The present invention relates to a method for removing inorganic foreign matters strongly attached to the surface of a substrate made of silicon or glass to be used as a silicon wafer, a photomask substrate or a photomask blank, the surface of a glass substrate for a template to be used for nanoimprinting, the surface of a substrate made of glass to be used as a substrate for various display devices, or the surface of an inorganic coating formed on the surface of such a substrate.

2. Discussion of Background

Heretofore, in a process for producing an integrated circuit, photolithography process which comprises reduction projection of a circuit pattern on a mask onto a wafer by using an exposure device to form an integrated circuit on the wafer has been widely utilized. Along with high integration and high functionality of integrated circuits, microsizing of an integrated circuit is in progress, and an exposure device is required to form an image of a circuit pattern with very small dimensions on a wafer with a long focal depth, and blue shift of the exposure light source is in progress. The exposure light source has been advanced from the conventional g-line (wavelength: 436 nm), i-line (wavelength: 365 nm) or KrF excimer laser (wavelength: 248 nm), and now an ArF excimer laser (wavelength: 193 nm) is being used. Further, in order to be prepared for a future integrated circuit where the line width of a circuit pattern will be at most 50 nm, use of a $F_2$ laser (wavelength: 157 nm) or EUV light (extreme ultraviolet light: wavelength: about 13 nm) as the exposure light source is promising.

Along with microsizing of the dimensions of an integrated circuit, the allowable size of foreign matters on a mask or a wafer has been increasingly small. For example, according to ITRS (International Technology Roadmap for Semiconductors), 2005, foreign matters allowable on a wafer to be used for production of a 32 nm half-pitch DRAM (random access memory) or in a resist coated on the wafer, are required to be such that "the density of foreign matters with a size of 20 nm is at most 0.01 foreign matter/$cm^2$", and in the case of a mask, it is required that no foreign matters with sizes of 26 nm or lager are present on the mask. Further, as a method of forming very small irregular patterns, nanoimprinting has been proposed and actively studied in addition to lithography. Since a 1x mask (template) is employed in nanoimprinting, it is required to reduce foreign matters with smaller sizes to the similar density, as compared with the requirement regarding foreign matters on the mask substrate for lithography. The required size of the foreign matters is smaller by about 30 nm than that in the case of a 80 nm half-pitch DRAM, and thus a method for effectively removing such very small foreign matters from the surface of a substrate made of silicon or glass to be used as a wafer or a mask, is required.

Further, in the case of a mask, the surface roughness is preferably as small as possible for the purpose of suppressing light scattering on the surface along with blue shift of the exposure light source. For example, in the case of a substrate for a reflective mask to be used for EUV lithography, a surface roughness (RMS) of at most 1.5 Å is required. Therefore, in the case of a substrate to be used as a mask, it is required to effectively remove the above very small foreign matters while the increase of the surface roughness is suppressed as far as possible.

As a method for removing foreign matters from a substrate made of silicon or glass, so-called lift-off process is commonly employed, i.e. a method of exposing the substrate surface to a chemical solution such as an acid or an alkali to carry out wet etching of the substrate surface in a very small amount to remove the foreign matters. For example, as proposed in Patent Document 1, the surface of a quartz glass substrate is exposed to hydrofluoric acid to carry out wet etching of the substrate surface, so that the distance between the substrate surface and foreign matters (e.g. inorganic foreign matters derived from colloidal silica glass or an alumina powder used for abrasion) attached to the substrate surface is extended to such an extent (at least about 5 to 10 Å) that the adhesion force (mainly Van der Waals force) will no more work out, whereby the foreign matters can be removed from the substrate surface. After the exposure to such a chemical solution, the substrate surface is rinsed with e.g. deionized water to replace the chemical solution with the deionized water, followed by drying. Further, in the case of a substrate to be used as a silicon wafer, Patent Document 2 for example proposes to remove foreign matters attached to the wafer surface by lift-off process in the same manner as above, by exposing the surface of the substrate to an aqueous solution containing hydrogen fluoride and hydrogen peroxide to oxidize silicon on the surface into silicon oxide utilizing oxidizing power of a hydrogen peroxide solution, and wet etching the resulting silicon oxide with hydrofluoric acid.

Here, in view of removal of foreign matters attached to a substrate by lift-off process, presence of electrical repulsive force between the foreign matters and the substrate is preferred. Namely, the foreign matters and the substrate surface preferably have the surface potential of the same sign. Further, in a case where the foreign matters and the substrate surface have the surface potential of the same sign, the absolute value of the difference in the surface potential between the foreign matters and the substrate is preferably as large as possible, whereby greater electrical repulsive force will be obtained.

The surface potential of most of substances (such as $SiO_2$, $Si_3N_4$ and organic substances) which can be foreign matters present on a substrate material or a substrate greatly depends on the pH of the liquid to which the surface is exposed. The surface potential is substantially 0 or slightly positive in the presence of a strong acid such as hydrofluoric acid i.e. in a region of pH=3 to 4, and the surface potential is negative in a weakly-acidic to alkaline region (3 to 4<pH). However, there are some exceptions. For example, the surface potential of Si has not have great pH dependence, and the surface potential is stably negative in a wide region of from acidic to alkaline (pH=3 to 11).

However, in a case where an acidic solution having a pH<7 is used as a chemical solution for the lift-off process, pH of the chemical solution is close to the equipotential, the surface potential of the substrate and the foreign matters is substantially 0 and accordingly substantially no electrical repulsive force is obtained. Thus, not only removal of the foreign matters from the substrate is difficult, but also the foreign matters suspended in the chemical solution, after once removed from the substrate, are likely to be attached to the substrate again.

Patent Document 1: JP-A-2002-131889
Patent Document 2: JP-A-3-120719

SUMMARY OF THE INVENTION

Under these circumstances, in order to overcome the above-described problems of prior art, it is an object of the present invention to provide a method for removing foreign matters, capable of easily removing inorganic foreign matters strongly attached to the surface of a substrate made of silicon or glass or to the surface of an inorganic coating formed on the substrate surface while the increase of the surface roughness is suppressed, and further capable of preventing reattachment of once removed foreign matters to the substrate surface.

To accomplish the above object, the present invention provides a method for removing inorganic foreign matters from the surface of a substrate made of silicon or glass or the surface of an inorganic coating formed on the surface of the substrate, which comprises applying a light beam in a wavelength range which makes the light absorption coefficient of at least one of a material of the substrate, a material of the inorganic coating and the inorganic foreign matters be at least 0.01/cm, to the surface of the substrate or to the surface of the inorganic coating in an application amount of at least 10 J/cm$^2$ in an oxygen- or ozone-containing atmosphere, and exposing the surface of the substrate or the surface of the inorganic coating having a negative surface potential to an acidic solution having a pH≦6.

The present invention further provides a method for removing inorganic foreign matters from the surface of a substrate made of silicon or glass or the surface of an inorganic coating formed on the surface of the substrate, which comprises applying a light beam in a wavelength range which makes the light absorption coefficient of at least one of a material of the substrate, a material of the inorganic coating and the inorganic foreign matters be at least 1/cm, to the surface of the substrate or to the surface of the inorganic coating in an application amount of at least 1 J/cm$^2$ in an oxygen- or ozone-containing atmosphere, and exposing the surface of the substrate or the surface of the inorganic coating having a negative surface potential to an acidic solution having a pH≦6.

The methods disclosed in paragraphs numbers [0006] and [0007] will hereinafter be referred to as the "foreign matter removal method of the present invention".

In the foreign matter removal method of the present invention, after the application of the light beam, the substrate surface or the inorganic coating surface is preferably treated with an aqueous solution or water vapor.

In the foreign matter removal method of the present invention, at the time of the exposure to an acidic solution having a pH≦6, the surface potential of the substrate surface or the inorganic coating surface is preferably at most −10 mV.

In the foreign matter removal method of the present invention, after the exposure to an acidic solution having a pH≦6, it is preferred to expose the substrate surface or the inorganic coating surface to an alkali solution having a pH of from 8 to 12 thereby to remove organic foreign matters from the substrate surface or the surface of an inorganic coating formed on the substrate surface.

In the foreign matter removal method of the present invention, the wavelength of the light beam is preferably at most 400 nm.

In the foreign matter removal method of the present invention, it is preferred that the wavelength of the light beam is at most 180 nm and that the oxygen concentration or the ozone concentration in the oxygen- or ozone-containing atmosphere is at most 10 vol %.

In the foreign matter removal method of the present invention, it is preferred that the wavelength of the light beam exceeds 180 nm and is at most 400 nm and that the oxygen concentration or the ozone concentration in the oxygen- or ozone-containing atmosphere is at least 0.1 volt and at most 50 vol %.

In the foreign matter removal method of the present invention, in the oxygen- or ozone-containing atmosphere, the total concentration of $H_2$ and $H_2O$ is preferably at most 1 vol %.

In the foreign matter removal method of the present invention, the substrate is preferably a substrate for a reflective mask blank for EUV lithography.

In the foreign matter removal method of the present invention, the surface roughness of the substrate is preferably at most 1.5 Å.

According to the foreign matter removal method of the present invention, inorganic foreign matters strongly attached to the surface of a substrate made of silicon or glass or to the surface of an inorganic coating formed on the substrate surface can easily be removed while the increase of the surface roughness is suppressed, and further, reattachment of once removed foreign matters to the substrate surface can be prevented.

MEANING OF SYMBOLS

1: substrate
10: lamp house
11: light source
20: process chamber
30: window
40: base
41: substrate chuck
50: nozzle
60: chemical solution

DETAILED DESCRIPTION OF THE PREFERRED EMBODIMENTS

The foreign matter removal method of the present invention is a method for removing inorganic foreign matters from the surface of a substrate made of silicon or glass or the surface of an inorganic coating formed on the substrate surface.

Here, the substrate made of silicon may, for example, be a silicon wafer.

The substrate made of glass may, for example, be a substrate made of glass to be used as a photomask substrate or a photomask blank, specifically, a glass substrate for a reflective mask blank for EUV lithography (EUV mask blank), a glass substrate for a template to be used for nanoimprinting or a substrate made of glass to be used as a substrate for various display devices. A material of the glass substrate may, for example, be alkali-free glass such as borosilicate glass, fused quartz glass, synthetic quartz glass, doped synthetic quartz glass having synthetic quartz glass intentionally doped with some substance such as titanium, fluorine, boron or aluminum, a glass ceramic or sapphire (alumina single crystal). Among them, preferred is a low-expansion glass having a coefficient of thermal expansion of $0\pm1\times10^{-7}/°$ C., specifically a synthetic quartz glass, a Ti-doped synthetic quartz glass or a glass ceramic having a coefficient of thermal expansion of $0\pm1\times10^{-7}/°$ C.

The inorganic coating formed on the substrate surface may be a coating containing, as a constituent, an inorganic compound or a metal such as Cr, $CrO_x$, CrN, CrFO, Si, MoSi, MoSiO, MoSiON, TaSiO, Ta, TaN, TaBN, TaSiBN, $SiO_2$, $TiO_2$, Ru, RuB or RuZr. Such an inorganic coating is formed, in the case of a glass substrate for a display device or a silicon wafer for example, to constitute a semiconductor device such as an insulating film or an electrode. Further, in the case of a photomask substrate, it is formed to play the role of adjustment so that the light entering the photomask substrate is selectively transmitted or reflected only at a required portion.

Further, in the case of a glass substrate for an EUV mask blank, the inorganic coating formed on the substrate surface includes a multilayer reflective film. Specific examples of the multilayer reflective film include a Si/Mo multilayer reflective film having a Si film and a Mo film alternately laminated, a Be/Mo multilayer reflective film having Be and a Mo film alternately laminated, a Si compound/Mo compound multilayer reflective film having a Si compound layer and a MO compound layer alternately laminated, a Si/Mo/Ru multilayer reflective film having a Si film, a Mo film and a Ru film laminated in this order, and a Si/Ru/Mo/Ru multilayer reflective film having a Si film, a Ru film, a Mo film and a Ru film laminated in this order.

The inorganic foreign matters to be removed in the present invention are meant for foreign matters containing, as the main component, an inorganic compound such as $SiO_2$, $Si_3N_4$, $Al_2O_3$, $Fe_3O_4$ or $CeO_2$, and metal foreign matters such as iron, stainless steel, chromium and aluminum.

Such inorganic foreign matters may, for example, be colloidal silica glass or an aluminum powder used for abrasion, attached to the substrate surface, abrasion dust generated by peeling of a part of the substrate surface during abrasion of the substrate surface, attached to the substrate surface, foreign matters attached by some cause during transport or storage of the substrate, foreign matters attached by some reason during a treatment (such as heat treatment or ion implantation) of the substrate, or foreign matters attached by some reason during the inspection of the substrate.

The inorganic foreign matters to be removed by the present invention are mainly nanoparticles having sizes less than 200 nm, particularly nanoparticles having sizes less than 100 nm.

In the foreign matter removal method of the present invention, the type of the light beam to be used and the application amount can not generically be defined since they depend on the degree of light absorption of the substrate material, the inorganic coating material and the inorganic foreign matter material. However, the greater the light absorption (the higher the light absorption coefficient), the smaller the light application amount required, and on the contrary, the smaller the light absorption, the larger the light application amount required.

Specifically, for example, in the case of a light beam in a wavelength range which makes the light absorption coefficient of at least one of the substrate material, the inorganic coating material and the inorganic foreign matter be at least 0.01/cm, it is required to apply the light beam in an amount of at least 10 $J/cm^2$ to the substrate surface or the surface of an inorganic coating formed on the substrate surface in an oxygen- or ozone-containing atmosphere. The following can be used as the light beam to be applied to the substrate surface or the inorganic coating surface.

(1) In a Case where No Inorganic Coating is Formed on the Substrate Surface (a) A light beam in a wavelength range which makes the light absorption coefficient of the substrate material be at least 0.01/cm.

(b) A light beam in a wavelength range which makes the light absorption coefficient of the inorganic foreign matters be at least 0.01/cm.

(2) In a Case where an Inorganic Coating is Formed on the Substrate Surface (c) A light beam in a wavelength range which makes the light absorption coefficient of the inorganic coating material be at least 0.01/cm.

(d) A light beam in a wavelength range which makes the light absorption coefficient of the inorganic foreign matters be at least 0.01/cm.

Here, in a case where a light beam in a wavelength range shared by (a) and (b) exists, it is preferred to use a light beam in a wavelength range shared by them. Further, in a case where a light beam in a wavelength range shared by (c) and (d) exists, it is preferred to use a light beam in a wavelength range shared by them. On the other hand, in a case where no light beam in a wavelength range shared by (a) and (b) exists, the light beam (a) is preferably used, and in a case where no light beam shared by (c) and (d) exists, the light beam (c) is preferably used.

Further, in the case of a light beam in a wavelength range which makes the light absorption coefficient of at least one of the substrate material, the inorganic coating material and the inorganic foreign matters be at least 1/cm, the light beam should be applied in an amount of at least 1 $J/cm^2$ to the substrate surface or the surface of an inorganic coating formed on the substrate surface in an oxygen- or ozone-containing atmosphere.

In such a case, the following may be used as the light beam to be applied to the substrate surface or the inorganic coating surface.

(1) In a Case where No Inorganic Coating is Formed on the Substrate Surface (a') A light beam in a wavelength range which makes the light absorption coefficient of the substrate material be at least 1/cm.

(b') A light beam in a wavelength range which makes the light absorption coefficient of the inorganic foreign matters be at least 1/cm.

(2) In a Case where an Inorganic Coating is Formed on the Substrate Surface (c') A light beam in a wavelength range which makes the light absorption coefficient of the inorganic coating material be at least 1/cm.

(d') A light beam in a wavelength range which makes the light absorption coefficient of the inorganic foreign matters be at least 1/cm.

Here, in a case where a light beam in a wavelength range shared by (a') and (b') exists, it is preferred to use a light beam in a wavelength range shared by them. Further, in a case where a light beam in a wavelength range shared by (c') and (d') exists, it is preferred to use a light beam in a wavelength range shared by them. On the other hand, in a case where no light beam in a wavelength range shared by (a') and (b') exists, the light beam (a') is preferably used, and in a case where no light beam shared by (a') and (d') exists, the light beam (c') is preferably used.

It is preferred to use a light beam in a wavelength range which makes the light absorption coefficient of at least one of the substrate material, the inorganic coating material and the inorganic foreign matters be at least 1/cm, i.e. the above light beam (a') to (d'), whereby the application amount required for light application is small and the exposure time is short.

Figure 1:
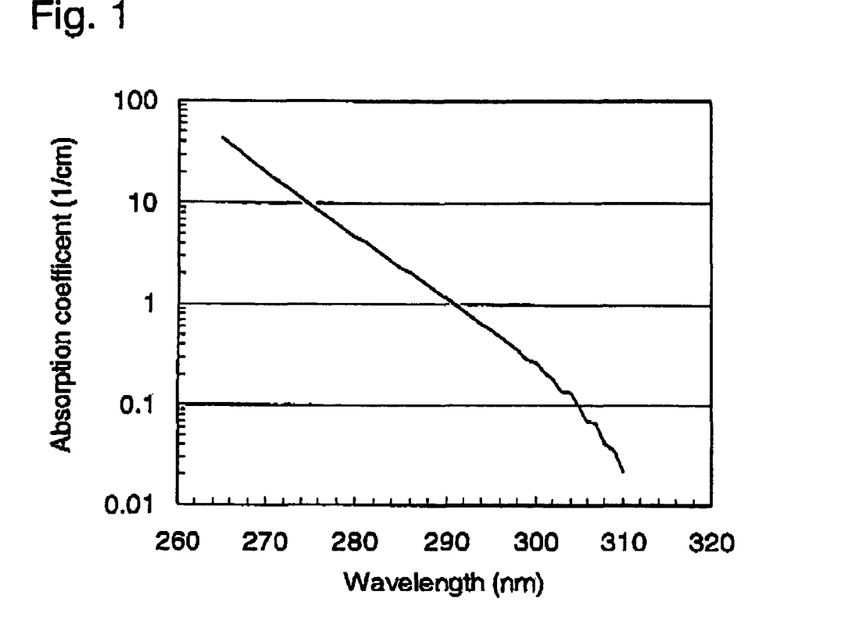
FIG. 1 is an absorption spectrum of a Ti-doped synthetic quartz glass (Ti-doping amount: 7 mass %).
Figure 2:
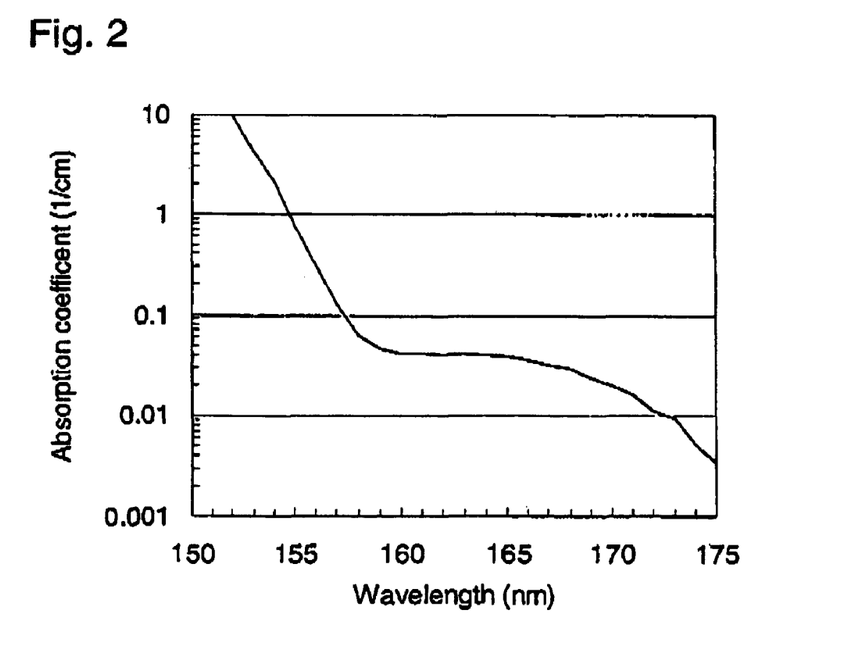
FIG. 2 is an absorption spectrum of a synthetic quartz glass having an OH content of 5 ppm.
Figure 3:
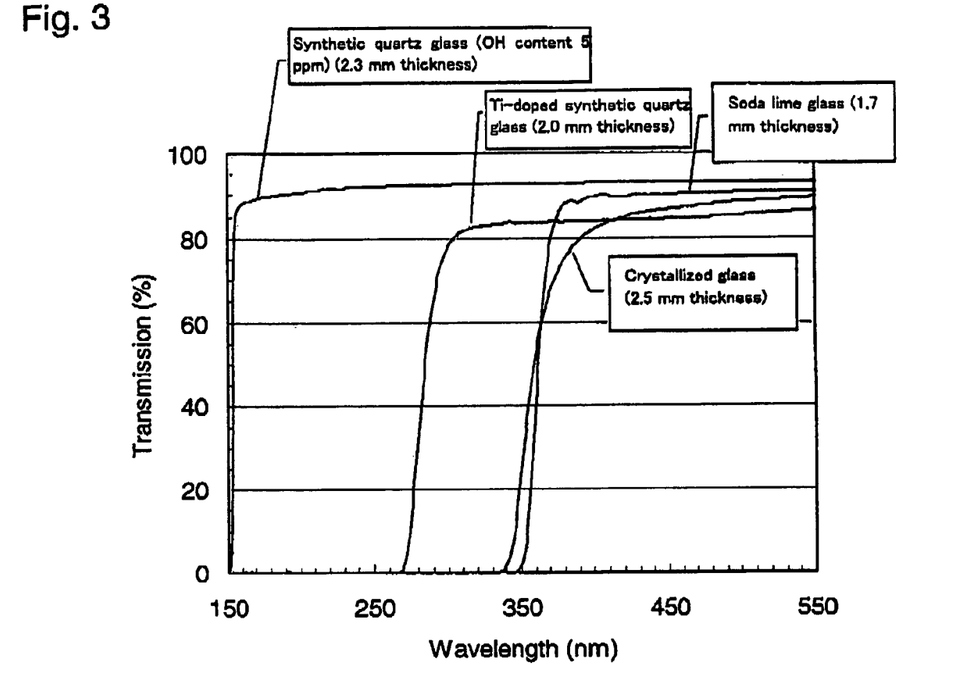
FIG. 3 illustrates light transmission spectra of various glasses with a thickness of about 2 mm in an ultraviolet to vacuum ultraviolet region.

Specific examples of a light beam in a wavelength range corresponding to the above (a) to (d) and (a') to (d') are shown below. FIG. 1 is an absorption spectrum of a Ti-doped synthetic quartz glass ($TiO_2$ content; about 5 to 10 mass %, $SiO_2$ content: about 90 to 95 mass %). In the case of this glass, the light absorption coefficient is at least 0.01/cm at a wavelength of at most about 315 nm, and the light absorption coefficient is at least 1/cm at a wavelength of at most 290 nm. Accordingly, in the case of a substrate made of this glass material, a light beam having a wavelength of at most 315 nm can be used as the light beam (a) and one having a wavelength of at most 290 nm can be used as the light beam (a'). FIG. 1 shows a spectrum up to a wavelength of 310 nm, but a light absorption coefficient of at least 0.01/cm even within a wavelength range of from 310 to 315 nm was confirmed from FIG. 1 by extrapolation. FIG. 2 is an absorption spectrum of a synthetic quartz glass having an OH content of 5 ppm. In this case, the light absorption coefficient is at least 0.01/cm at a wavelength of at most about 174 nm, and the light absorption coefficient is at least 1/cm at a wavelength of at most about 155 nm. Accordingly, in the case of a substrate made of this glass material, a light beam having a wavelength of at most 174 nm can be used as the light beam (a), and one having a wavelength of at most 155 nm can be used as the light source (a'). FIG. 3 illustrates light transmission spectra of various glasses including the Ti-doped synthetic quartz glass shown in FIG. 1, the synthetic quartz glass having an OH content of 5 ppm shown in FIG. 2, a crystallized glass ($SiO_2$—$Al_2O_3$—$Li_2O$—$TiO_2$—$ZrO_2$—$P_2O_5$, glass, NEOCERAM (tradename) manufactured by Nippon Electric Glass Co., Ltd.) and a soda lime glass (AS (tradename) manufactured by Asahi Glass Company, Limited) with a thickness of about 2 mm in an ultraviolet to vacuum ultraviolet region (150 to 550 nm). As evident from FIG. 3, the transmissions of the Ti-doped synthetic quartz glass and the synthetic quartz glass having an OH content of 5 ppm dramatically decrease by the increase of the absorption coefficient in wavelength ranges of at most 290 nm and at most 155 nm, respectively, and light beams at such wavelength regions can be used as the light beam (a'). Further, in the case of the crystallized glass and the soda lime glass, the transmission dramatically decreases at a wavelength of at most about 350 nm, and a light beam having a wavelength of at most 350 nm which makes the light absorption coefficient be at least 0.01/cm can be used as the light beam (a).

In the present invention, all the substrate, the inorganic coating and the inorganic material constituting foreign matters show relatively similar absorption spectra. Accordingly, a light beam having a wavelength of at most 400 nm can be used as the above light beam (a) to (d) and (a') to (d').

In the foreign matter removal method of the present invention, the light source to be used for applying a light beam to the substrate surface or the inorganic coating surface can be widely selected from light sources generating the above light beam having a wavelength range of at most 400 nm. Specifically, a high-pressure mercury lamp (dominant wavelength: 250 to 320 nm, 365 nm), a low-pressure mercury lamp (dominant wavelength: 185 nm, 254 nm), a dielectric barrier discharge lamp filled with XeCl gas (dominant wavelength: 308 nm), a dielectric barrier discharge lamp filled with KrCl gas (dominant wavelength: 222 nm), a dielectric barrier discharge lamp filled with $Xe_2$ gas (dominant wavelength: 172 nm), a dielectric barrier discharge lamp filled with Kr gas (dominant wavelength: 146 nm), a dielectric barrier discharge lamp filled with $Ar_2$ gas (dominant wavelength: 126 nm), a XeCl excimer laser (dominant wavelength: 308 nm), a KrF excimer laser (dominant wavelength: 248 nm), an ArF excimer laser (dominant wavelength: 193 nm) and a $F_2$ laser (dominant wavelength: 157 nm) may be mentioned.

Among these light sources, a desired light source should be selected depending upon the substrate material, the inorganic coating material and the inorganic foreign matters to which the light source is applied. For example, in a case where the substrate material is the Ti-doped synthetic quartz glass, the absorption spectrum of which is shown in FIG. 1, a light source at a wavelength of at most 315 nm may be employed as the light beam (a), and a light source at a wavelength of at most 290 nm can be used as the light beam (a'). As a light source at a wavelength of at most 290 nm, a lamp light source such as a low-pressure mercury lamp (dominant wavelength; 185 nm, 254 nm), a dielectric barrier discharge lamp filled with KrCl gas (dominant wavelength: 222 nm) or a dielectric barrier discharge lamp filled with $Xe_2$ gas (dominant wavelength: 172 nm) is useful from such reasons that a light source with a relatively high illuminance can be available at a relatively low cost, the running cost tends to be low, and a relatively large area can be irradiated all at once. Further, in the case of the synthetic quartz glass, the absorption spectrum of which is shown in FIG. 2, a light source at a wavelength of at most 174 nm can be used as the light beam (a), and a light source at a wavelength of at most 155 nm can be used as the light beam (a'). As the light source at a wavelength of at most 174 nm, a dielectric barrier discharge lamp filled with $Xe_2$ gas (dominant wavelength: 172 nm) can be used, and as the light source at a wavelength of at most 155 nm, a dielectric barrier discharge lamp filled with Kr gas (dominant wavelength: 146 nm) can be used.

In the present invention, by application of the above light beam (a) to (d) in an application amount of at least 10 $J/cm^2$ to the substrate surface or the surface of the inorganic coating formed on the substrate surface in an oxygen- or ozone-containing atmosphere, bonds in the material constituting the substrate surface, the material constituting the inorganic coating surface or the material constituting the surface of the inorganic foreign matters will undergo cleavage. Further, by application of the above light beam (a') to (d') in an application amount of at least 1 $J/cm^2$ to the substrate surface or the surface of the inorganic coating formed on the substrate surface in an oxygen- or ozone-containing atmosphere, bonds in the material constituting the substrate surface, the material constituting the inorganic coating surface or the material constituting the surface of the inorganic foreign matters will undergo cleavage.

Specifically, when the light beam (a) or (a') is applied to the substrate surface, bonds in the material constituting the substrate surface will undergo cleavage. Similarly, when the light beam (b) or (b') is applied to the substrate surface, bonds in the material constituting the surface of the inorganic foreign matters will undergo cleavage, when the light beam (c) or (c') is applied to the inorganic coating surface, bonds in the material constituting the inorganic coating surface will undergo cleavage, and when the light beam (d) or (d') is applied to the inorganic coating surface, bonds in the material constituting the surface of the inorganic foreign matters will undergo cleavage.

On the other hand, oxygen molecules in the atmosphere will become active species (oxygen active species) such as oxygen radicals (O.), ozone ($O_3$) or excited oxygen ($O_2$*) by application of the light beam. Further, ozone in the atmosphere is originally an active species, and becomes active species (ozone active species) such as oxygen radicals (O.) or excited oxygen ($O_2$*) by application of the light beam. The cleft bonds in the substrate surface, the inorganic coating surface or the surface of the inorganic foreign matters will easily be bonded to the above oxygen active species or ozone active species in the atmosphere and be terminated by uncrosslinked oxygen radicals. Then, by the treatment of the substrate surface or the inorganic coating surface with water vapor or with an aqueous solution, the uncrosslinked oxygen radicals present in the substrate surface, the inorganic coating surface or the surface of the inorganic foreign matters will be terminated with OH groups, whereby a large number of OH groups are present in the substrate surface, the inorganic coating surface or the surface of the inorganic foreign matters. By the presence of a large number of OH groups in the substrate surface, the inorganic coating surface or the surface of the inorganic foreign matters, the substrate surface or the inorganic coating surface will have a negative surface potential when the substrate surface or the inorganic coating surface is exposed to an acidic solution later.

The mechanism how the substrate surface is terminated with OH groups by the above procedure will be described with reference to a case where a light beam is applied to a quartz glass ($SiO_2$) substrate in an oxygen-containing atmosphere.

First, in step 1, the Si—O bond in the substrate surface will undergo radical decomposition by application of a light beam in a wavelength range which makes the light absorption coefficient be at least 0.01/cm in an application amount of at least 10 J/cm² to the substrate surface or by application of a light beam in a wavelength range which makes the light absorption coefficient be at least 1/cm in an application amount of at least 1 J/cm² to the substrate surface, in an oxygen-containing atmosphere.

At the same time, also oxygen molecules in the atmosphere will undergo radical decomposition by application of the light beam.

Step 1: Excitation Reaction by Light Application

Then, in step 2, the substrate surface is terminated with uncrosslinked oxygen radicals by reaction of one of the formed radicals (Si radical and Si—O radical) with an oxygen radical or an oxygen molecule.

Step 2: Termination by Uncrosslinked Oxygen Radicals

Finally, in step 3, $H_2O$ and uncrosslinked oxygen radicals are bonded by treatment of the substrate surface with an aqueous solution or water vapor, and the substrate surface is terminated with OH groups.

Step 3: Termination by Hydroxyl Groups

In such a manner, a large number of OH groups are present in the substrate surface. When the substrate surface is exposed to an acidic solution having a pH≦6 later, the OH groups in the substrate surface will undergo dissociation so that H is desorbed to form O⁻, whereby the substrate will have a negative surface potential.

Even when the substrate surface is not treated with an aqueous solution or water vapor after the substrate surface is terminated with uncrosslinked oxygen radicals in Step 2, the substrate surface will be terminated with OH groups by the same action as the above step 3 when the substrate surface is exposed to an acidic solution having a pH≦6. Thus, treatment of the substrate surface with an aqueous solution or water vapor after termination of the substrate surface with uncrosslinked oxygen radicals in step 2 is not necessarily required.

Here, in a case where treatment with an aqueous solution or treatment with water vapor is carried out in step 3, they are preferably carried out under the following conditions, respectively.

(Treatment with Aqueous Solution)

The substrate surface should be exposed to deionized water. Specifically, the substrate is immersed in a container containing deionized water. Otherwise, deionized water is discharged and supplied to the substrate surface. The temperature of the deionized water to be used for the treatment is preferably from room temperature to 80° C., and the treatment time is preferably from 3 to 10 minutes.

(Treatment with Water Vapor)

The substrate should be exposed to an atmosphere containing water vapor. The atmosphere containing water vapor preferably has a humidity of from 40% RH to 100% RH and a temperature of from room temperature to 80° C. Further, the treatment time is preferably from 3 to 10 minutes.

Here, application of a light beam to the substrate surface prior to removal of foreign matters attached to the substrate surface is disclosed in the following documents.

Document 1: K. Masui et al., "Ultra-fine Mask Cleaning Technology using Ultra-violet Irradiation", SPIE, vol. 3412, p. 447 (1998)

Document 2: J. Zheng, et. al., "Impact of surface contamination on transmittance of modified fused silica for 157-nm lithography application" SPIE, vol. 4186, p. 767 (2001)

Document 3; Hiroshi Sugawara et al, "Photocleaning employing dielectric barrier discharge excimer lamp", Summary of the Meeting for The Society of Chemical Engineers, Japan at Himeji, SD2-15 (1996)

Document 4: Iso et al, "Study on UV/$O_3$ cleaning employing $Xe_2$* excimer lamp", Journal of the illuminating Engineering Institute of Japan, vol. 83, No. 5 (1999)

Document 5: JP-A-2003-71399

However, methods disclosed in these documents are to remove organic matters attached to the substrate surface by decomposition thereby to improve wettability of the substrate, and accordingly the light beam to be applied to the substrate surface, particularly the application amount of the light beam is totally different from that of the present invention, and effects achieved by the application of the light beam are also totally different from those of the present invention. Now, the difference between them will be described in further detail.

For example, in Document 3, in a case where a light (dominant wavelengths: 185 nm and 254 nm, illuminances immediately beneath the luminous tube at the respective wavelengths: 15 mW/cm² (185 nm) and 120 mW/cm² (254 nm)) emitted from a low-pressure mercury lamp is applied to the surface of a quartz glass as the light beam application for the purpose of improving wettability of a substrate (wettability-improving treatment to lower the contact angle of the substrate to water to be at most about 10°), an exposure time of from about 3 to about 5 minutes is required. Further, in a case where a light (dominant wavelength; 172 nm, illuminance at the window wall: 6.7 mW/cm$^2$) emitted from a dielectric barrier discharge lamp filled with $Xe_2$ gas is applied to the surface of a quartz glass, an exposure time of about 1 minute is required. Here, the light absorption coefficient of the quartz glass depends on the type of the quartz glass but is usually so small as at most 0.1/cm (172 nm), at most 0.01/cm (185 nm) or at most 0.001/cm (254 nm), although it is not disclosed in Document 3 in detail and is not exactly known, and the quantity of light absorbed in the quartz glass at the time of the light beam application is very small at each wavelength (185 nm; at most 45 mJ/cm$^2$·cm, 254 nm: at most 36 mJ/cm$^2$·cm, and 172 mm: at most 40 mJ/cm$^2$·cm, as calculated by means of the light absorption coefficient). Further, the photon energy of the light beam (172 nm: 7.2 eV, 185 nm: 6.7 eV, 254 nm: 4.9 eV) is small as compared with the bond energy (8 to 9 eV) of the Si—O bond at each wavelength, and multiphoton absorption is required for cleavage of the Si—O bond, and thus the light beam application for a long time is required. Thus, under practical conditions for light beam application, substantially no Si—O bonds constituting the quartz glass will undergo cleavage, and the amount of uncrosslinked oxygen radicals formed on the quartz glass surface is very small, if any. Thus, at the time of cleaning with an acidic solution, the quartz glass surface does not substantially has a negative surface potential.

Whereas, in the present invention, by applying a light beam in a wavelength range which makes the light absorption coefficient of at least one of the substrate material, the inorganic coating material and the inorganic foreign matters be at least 0.01 cm, to the substrate surface or to the surface of the inorganic coating formed on the substrate surface in an application amount of at least 10 J/cm$^2$, or by applying a light beam in a wavelength range which makes the light absorption coefficient of at least one of the substrate material, the inorganic coating material and the inorganic foreign matters be at least 1 cm, to the substrate surface or to the surface of the inorganic coating formed on the substrate surface in an application amount of at least 1 J/cm$^2$, in an oxygen- or ozone-containing atmosphere, bonds in a material constituting the substrate surface, a material constituting the inorganic coating surface or a material constituting the surface of the inorganic foreign matters undergo cleavage, and the active species generated by activation of oxygen molecules or ozone molecules in the atmosphere by the light beam application are bonded to the cleft bonds, whereby uncrosslinked oxygen radicals are intentionally generated in the substrate surface or the inorganic coating surface. As a result, when exposed to an acidic solution having a pH≦6, the substrate surface or the inorganic coating surface has a negative surface potential by a large number of OH groups formed by bonding of the uncrosslinked oxygen radicals to $H_2O$. For example, in the case of a substrate made of the synthetic quartz glass (OH content: 5 ppm) having an absorption spectrum shown in FIG. 2, when a $Kr_2$ excimer lamp beam (illuminance: 5 mW/cm$^2$) which mainly emits light having a wavelength in the vicinity of 146 nm providing a light absorption coefficient of at least 10/cm is applied for 10 minutes in an oxygen-containing atmosphere (e.g. oxygen/nitrogen=0.1/99.9 vol %), the application amount of the light beam is so large as 3 J/cm$^2$, and the photon energy of the light source is 8.5 eV and is substantially equal to the bond energy (8 to 9 eV) of the Si—O bond, and accordingly the Si—O bonds will effectively undergo cleavage by means of one-photon absorption, and uncrosslinked oxygen radicals can be intentionally formed on the substrate surface.

Thus, the present invention is similar to a conventional method of removing organic matters from the surface of a quartz substrate by decomposition for improvement of wettability in that a light beam is applied to the substrate surface as a treatment prior to removal of foreign matters, but it is to actively make bonds in a material constituting the substrate surface, a material constituting the inorganic coating surface or a material constituting the surface of inorganic foreign matters undergo cleavage, and a light beam having a photon energy comparable to the bond energy of the material or higher than that is required. Namely, it is required to use a light beam in a wavelength range which makes the light absorption coefficient of at least one of the substrate material, the inorganic coating material and the inorganic foreign matters be at least 0.01/cm or at least 1/cm.

Further, not only selection of the wavelength but also the application amount of the light beam is important, and it is required to apply a light beam in a wavelength range which makes the light absorption coefficient be at least 0.01/cm or a light beam in a wavelength range which makes the light absorption coefficient be at least 1/cm in a sufficient application amount. Specifically, in a case where the light absorption coefficient is at least 0.01/cm and less than 1/cm, in the excitation reaction by light application in the above step 1, the multiphoton absorption procedure is dominant (particularly two-photon absorption procedure is dominant among multiphoton absorption procedure), and accordingly it is required to apply a light beam so that the quantity of light (application amount×square of light absorption coefficient) absorbed in the substrate surface, the inorganic coating surface of the surface of the inorganic foreign matters is at least 0.1 J/cm$^2$·cm$^2$. Accordingly, it is required to apply a light beam in a wavelength range which makes the light absorption coefficient be at least 0.01/cm in an application amount of at least 10 J/cm$^2$.

On the other hand, in a case where the light absorption coefficient is at least 1/cm, in the excitation reaction by light application in the above step 1, one-photon absorption procedure is dominant, and accordingly it is required to apply a light beam so that the quantity of light (application amount× light absorption coefficient) absorbed in the substrate surface, the inorganic coating surface or the surface of the inorganic foreign matters is at least 1 J/cm$^2$·cm. Accordingly, it is required to apply a light beam in a wavelength range which makes the light absorption coefficient be at least 1/cm in an application amount of at least 1 J/cm$^2$.

Since a light beam in a wavelength range which makes the light absorption coefficient be a certain value is applied to the substrate surface or the inorganic coating surface in a sufficient application amount as mentioned above, there is fear that the substrate or the inorganic coating will be damaged. However, since most of the applied light beam is absorbed in the very surface of the substrate, the mechanical properties (such as Young's modulus), thermal properties (such as coefficient of thermal expansion), optical properties (such as light beam transmission) and chemical properties (such as chemical resistance) of the substrate as a whole will not be impaired. From the same reason, the properties of the inorganic coating will not be impaired.

However, in view of prevention of the damages to the substrate or the inorganic coating, in the case of a light beam in a wavelength range which makes the light absorption coefficient be at least 0.01/cm, it is preferred to apply it in an application amount of at least 1,000 J/cm$^2$, and in the case of a light beam in a wavelength range which makes the light absorption coefficient be at least 1/cm, it is preferred to apply it in an application amount of at least 100 J/cm².

Here, as described with reference to Document 3, the application amount of the light beam is small in Documents 1 to 5 as compared with that of the present invention, and the estimated reason is that the damage to the substrate surface is blindly believed problematic.

The illuminance of the light beam to be applied to the substrate surface or the inorganic coating surface depends on the light absorption coefficient of the substrate material, the inorganic coating material or the inorganic foreign matters, but is preferably at least 3 mW/cm², particularly preferably at least 5 mW/cm², whereby the exposure time required to achieve an application amount of at least 10 J/cm² (in the case of a light absorption coefficient of at least 0.01/cm) or at least 1 J/cm² (in a case of a light absorption coefficient of at least 1/cm) can be shortened.

On the other hand, in view of prevention of the damages to the substrate or the inorganic coating, the illuminance of a light beam to be applied to the substrate surface or the inorganic coating surface is preferably at most 100 mW/cm², particularly preferably at most 50 mW/cm².

Further, the exposure time of the light beam depends on the quantity of light to be absorbed in the substrate surface, the inorganic coating surface or the inorganic foreign matters, but it is preferred to apply the light beam so that the application amount is at least 1 J/cm², more preferably at least 3 J/cm², when a light source which makes the absorption coefficients of the substrate be at least 1/cm is used. Further, in a case where a light source which makes the absorption coefficient of the substrate be at least 0.01/cm is used, it is preferred to apply the light beam so that the application amount is at least 10 J/cm², more preferably at least 15 J/cm².

Further, the light beam may be applied all at once to the entire substrate surface or the entire inorganic coating surface, or in the case of a light source having an irradiation area smaller than the substrate surface or the inorganic coating surface, the substrate or the inorganic coating can be scanned with the light beam. However, in view of the throughput, it is preferred to apply the light beam all at once to the entire substrate or the entire inorganic coating.

Figure 4:
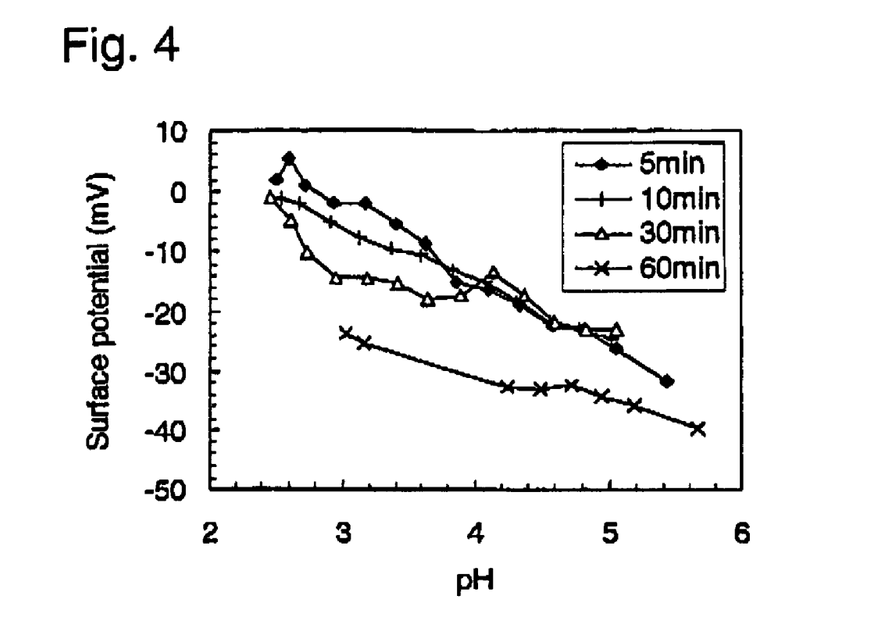
FIG. 4 illustrates pH dependence of the surface potential after application of the light beam with respect to the Ti-doped synthetic quartz glass of which the absorption spectrum is shown in FIG. 1.
Figure 5:
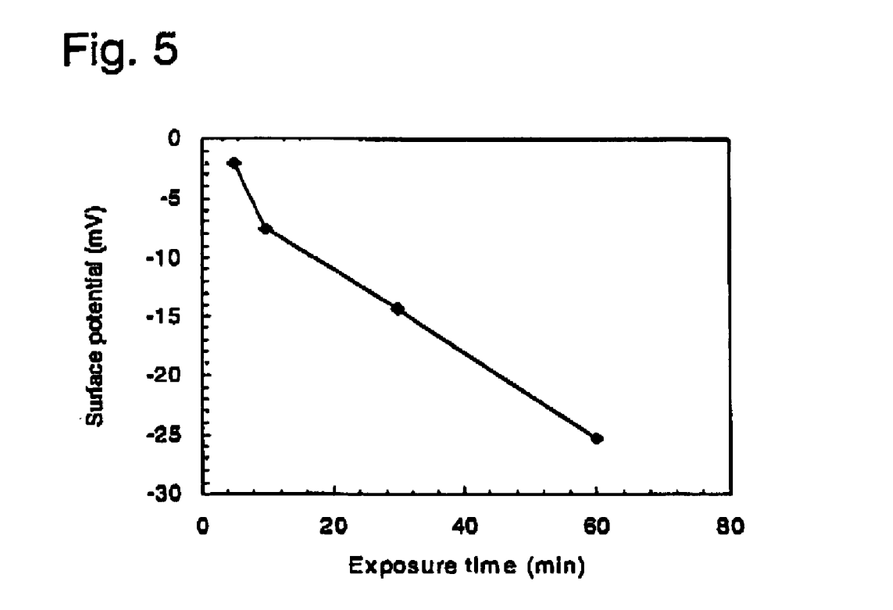
FIG. 5 illustrates the exposure time dependence of the surface potential in the vicinity of pH=3.1 with reference to FIG. 4.

In FIG. 4 is shown the pH dependence of the surface potential when a light beam from a dielectric barrier discharge lamp filled with $Xe_2$ gas (dominant wavelength: 172 nm, illuminance at the window wall: 10 mW/cm², manufactured by USHIO INC.) is applied to the Ti-doped synthetic quartz glass ($TiO_2$ concentration; 7 mass %, $SiO_2$ concentration; 93 mass %) having the absorption spectrum shown in FIG. 1. Further, in FIG. 5 is shown the exposure time dependence of the surface potential in the vicinity of pH=3.1 with reference to FIG. 4. The surface potential was measured by using a surface potential meter (EI-BKA manufactured by Brookhaven) in such a manner that two substrates made of the same material were prepared and irradiated by a dielectric barrier discharge lamp filled with $Xe_2$ gas (dominant wavelength: 172 nm, illuminance at the window wall: 10 mW/cm², manufactured by USHIO INC.) in an atmosphere of nitrogen/oxygen=80/20 vol % for from 5 to 60 minutes for surface modification, and they were overlaid with a distance of about 100 μm so that the measurement surfaces faced each other to constitute a cell, and the cell was filled with an acidic solution having a predetermined pH.

As evident from FIG. 4, the OH modified group concentration on the surface tends to increase, the pH at the equipotential tends to decrease, and the substrate surface tends to have a negative surface potential over a wide pH range, as the exposure time increases. Further, it is also understood that the absolute value of the negative surface potential tends to be larger in an acidic range of pH≦6, as the exposure time increases. Further, as evident from FIG. 5, the absolute value of the negative surface potential tends to be large as the exposure time increases. Here, in FIGS. 4 and 5, the degree of the absolute value of the negative surface potential indicates the degree of the OH groups present on the substrate surface. Namely, a larger absolute value of the negative surface potential means a larger amount of OH groups present on the substrate surface.

As mentioned above, the application of the light beam to the substrate surface or the inorganic coating surface is carried out in an oxygen-containing atmosphere or in an ozone-containing atmosphere. The reason why the light beam application is carried out in an oxygen-containing atmosphere or in an ozone-containing atmosphere is that the substrate surface, the inorganic coating surface or the surface of the inorganic foreign matters is terminated with uncrosslinked oxygen radicals in the above step 1 and step 2, and then the substrate surface, the inorganic coating surface or the surface of the inorganic foreign matters is terminated with OH groups in step 3. In addition, in a case where the substrate, the inorganic coating or the inorganic foreign matters are formed by a metal, the surface of such a metal is converted to a metal oxide by the light beam application in an oxygen-containing atmosphere or in an ozone-containing atmosphere. For example, in the case of silicon, its surface is converted to silicon oxide. Then, at the time of exposure to an acidic solution having a pH≦6, the oxidized surface layer is removed by use of an acidic solution which erodes silicon oxide such as hydrofluoric acid or buffered hydrochloric acid, whereby removal of foreign matters from the surface will be accelerated. In the case of another metal also, the same effects will be obtained by use of an acidic solution which erodes the desired metal oxide at the time of exposure to an acidic solution having a pH≦6.

Here, the oxygen-containing atmosphere means an atmosphere containing oxygen in a predetermined amount. In a case where a light beam in a wavelength range (at least 185 nm and less than 400 nm) in which oxygen molecules absorbs substantially no light is used, the oxygen content in the atmosphere is preferably high so as to accelerate the above step 1 and step 2. Specifically, the oxygen content is preferably at least 1 vol %, particularly preferably at least 10 vol %. On the other hand, in a case where a light beam in a wavelength range (less than 185 nm) in which oxygen molecules absorb light is used, if the oxygen content is high, the amount of the light beam applied to the substrate surface will decrease since the proportion of the applied light beam absorbed by oxygen will be high. Accordingly, the oxygen content is preferably at most 1 volt, particularly preferably at most 0.1 volt. However, the oxygen content is preferably at least 0.001 volt so as to carry out the above step 1 and step 2.

Here, if $H_2$ or $H_2O$ exists in the atmosphere in the above step 1, $H_2$ or $H_2O$ will undergo radical decomposition to form hydrogen radicals.

As a result, in the above step 2, some part of the substrate surface is terminated with hydrogen (—H) instead of uncrosslinked oxygen radicals.

If the part of the substrate surface terminated with H is large, the equipotential tends to shift towards the high pH side when the substrate surface is exposed to an acidic solution having a pH≦6, the potential on the substrate surface tends to be positive and, even if it is a negative value, the absolute value tends to be small.

Accordingly, substantially no $H_2$ nor $H_2O$ exists in the atmosphere at the time of light beam application, and specifically, the content of $H_2$ and $H_2O$ in the atmosphere is preferably at most 1 volt in total, particularly preferably at most 0.1 volt.

Accordingly, in the oxygen-containing atmosphere or the ozone-containing atmosphere, the component other than oxygen and ozone is preferably an inert gas. The inert gas may, for example, be nitrogen, argon, krypton or helium.

Further, the pressure of the oxygen-containing atmosphere or the ozone-containing atmosphere is not particularly limited, but it is preferably high since oxygen and ozone are required in the above step 1 and step 2, specifically, it is preferably normal pressure.

In the foreign matter removal method of the present invention, after the substrate surface, the inorganic coating surface or the surface of the inorganic foreign matters is terminated with OH groups by the above procedure, the substrate surface or the inorganic coating surface is exposed to an acidic solution having a pH≦6. As mentioned above, since a large amount of OH groups exist on the substrate surface, the inorganic coating surface or the surface of the inorganic foreign matters, the substrate surface or the inorganic coating surface has a negative surface potential when exposed to an acidic solution having a pH≦6.

By the substrate surface or the inorganic coating surface having a negative surface potential when exposed to an acidic solution having a pH≦6, a high electrical repulsive force occurs between the substrate surface and the inorganic foreign matters or between the inorganic coating surface and the inorganic foreign matters, whereby the inorganic foreign matters can easily be removed from the substrate surface or the inorganic coating surface and reattachment of the inorganic foreign matters removed from the substrate surface or the inorganic coating surface to such a surface can be prevented.

From the above reasons, the absolute value of the negative surface potential of the substrate surface or the inorganic coating surface is preferably large. Specifically, the surface potential is preferably at most −10 mV, more preferably at most −15 mV, furthermore preferably at most −20 mV.

Then, the substrate surface or the inorganic coating surface is exposed to an acidic solution having a pH≦6 by some method. As a method of supplying the acidic solution to the substrate surface or the inorganic coating surface, the following two methods may be conceivable.

(1) A spin method of rotating the substrate in such a state that the acidic solution is supplied to the substrate from a nozzle disposed above the substrate, whereby a liquid membrane consisting of the acidic solution is formed on the substrate.

(2) A batch method of dipping the substrate in a tank filled with the acidic solution.

Ultrasonic waves at a frequency of 500 to 5 MHz may be applied when the acidic solution is supplied. In the case of the above method (1), the acidic solution to which ultrasonic waves have been applied is supplied to the substrate. In the case of the method (2), ultrasonic vibrators are disposed inside and outside the tank to apply ultrasonic waves to the acidic solution in which the substrate is immersed. Otherwise, the acidic solution may be sprayed on the substrate surface under a relatively high pressure (pressure 20 to 100 PSi), or mechanical force may be applied by e.g. rubbing the substrate with a brush or the like while supplying the acidic solution. Particularly, the above method of applying ultrasonic waves is preferred since it is effective for removal of foreign matters with various sizes including small foreign matters with sizes at a level of several tens of nm to relatively large foreign matters at a level of 1 μm.

The acidic solution to be used may be an acid such as hydrofluoric acid (HF, 0.01 to 0.5 wt %), buffered hydrofluoric acid (mixed solution of HF and $NH_4F$, HF=0.01 to 0.5 wt %, $NH_4F$=20 to 40 wt*), hydrochloric acid (HCl), nitric acid ($HNO_3$) or an organic acid (such as acetic acid or citric acid), a mixed solution of such an acid with ozone water, a mixed solution of such an acid with a hydrogen peroxide solution, a mixed solution of such an acid with an alkaline surfactant (such as CLEANTHROUGH manufactured by Kao Corporation, LC-2 manufactured by YOKO OILS & FATS INDUSTRY CO., LTD. or SUNWASH manufactured by LION CORPORATION) or with deionized water (pH=7), or deionized water (pH=4 to 6) having carbon dioxide gas dissolved therein.

In a case where the main component of the substrate material, the inorganic coating material or the inorganic foreign matters is $SiO_2$, it is particularly preferred to use an acidic solution which erodes silicon oxide such as hydrofluoric acid or buffered hydrofluoric acid as the acidic solution, whereby the surface is etched in a very small amount and removal of the inorganic foreign matters from the substrate surface or the inorganic coating surface is thereby accelerated.

In the foreign matter removal method of the present invention, after the substrate surface or the inorganic coating surface is exposed to an acidic solution having a pH≦6 to remove the inorganic foreign matters from the substrate surface or the inorganic coating surface, it is preferred to expose the substrate surface or the inorganic coating surface to an alkali solution having a pH of from 8 to 12 to remove organic foreign matters attached to the substrate surface or the inorganic coating surface.

According to methods disclosed in the above Documents 1 to 5, organic matters attached to the substrate surface or the inorganic coating surface are decomposed and removed in accordance with the following formula, by the light beam application to the substrate surface or the inorganic coating surface.

$$C_xH_y+O.\rightarrow xCO_2+y/2H_2O$$

However, part of the organic foreign matters remain undecomposed on the substrate surface or the inorganic coating surface. Further, organic residues generated by decomposition of part of the organic foreign matters remain on the substrate surface or the inorganic coating surface. Further, organic foreign matters are included in the acidic solution in some cases, and such organic foreign matters will be attached to the substrate surface or the inorganic coating surface when the substrate surface or the inorganic coating surface is exposed to the acidic solution.

In an acidic range of pH=2 to 5, such organic foreign matters do not have a negative surface potential. Thus, no electrostatic repulsive force can be expected between the substrate surface or the inorganic coating and the organic matters, but electrostatic attractive force will work out between them, and accordingly, the organic foreign matters are strongly attached to the substrate surface or the inorganic coating surface.

On the other hand, in an alkaline range of pH>7, preferably pH=8 to 12, the surface of the organic foreign matters has a negative surface potential, and the substrate surface or the inorganic coating surface has a negative surface potential, and thus a high electrical repulsive force will work out between the substrate surface and the organic foreign matters or between the inorganic coating surface and the organic foreign matters, whereby the organic foreign matters can easily be removed from the substrate surface or the inorganic coating surface, and reattachment of the organic foreign matters removed from the substrate surface or the inorganic coating surface to such a surface can be prevented.

As a method of supplying an alkali solution having a pH>7, preferably pH=8 to 12 to the substrate surface or the inorganic coating surface, a spin method or a batch method may be used in the same manner as supply of the acidic solution to the substrate surface or the inorganic coating surface. Further, when the alkali solution is supplied, ultrasonic waves at a frequency of 500 to 5 MHz may be applied.

The alkali solution may be ammonia water (0.1 to 1 wt %, pH=9 to 12), a mixed solution (pH=9 to 12) of ammonia water (0.01 to 1 wt %) with hydrogen water (1 to 5 ppm), a mixed solution (pH=9 to 12) of ammonia water (0.1 to 1 wt %) with a hydrogen peroxide solution (0.1 to 1 wt %) or an alkaline surfactant ($7<pH\leqq12$).

It is preferred, after the exposure to an acidic solution and before the exposure to an alkali solution, to wash out the acidic solution from the substrate surface or the inorganic coating surface by using deionized water, from the following reasons.

If an alkali solution is mixed with an acidic solution, a salt formed by neutralization may be a new foreign matter. Further, heat generation may result from the neutralization. Further, in some cases, the acidic solution or the alkaline solution may splash on the surroundings by neutralization vigorously proceeding, which may not only stain the apparatus but also be problematic in view of safety.

Further, after the exposure to an alkali solution, it is preferred to wash out the alkali solution from the substrate surface or the inorganic coating surface by using deionized water. The glass substrate washed with deionized water, after dried, is subjected to further treatment depending upon the purpose of use.

EXAMPLES

Example 1 (Comparative Example)

A substrate with a size of 6×6×0.26 (inch) is cut out from a quartz glass block synthesized by flame hydrolysis, and the surface of the substrate is mirror-polished by means of particles comprising cerium oxide and silicon oxide to the surface roughness of 1.2 Å (RMS). The polished substrate is subjected to scrub cleaning by using a polyvinyl alcohol (PVA) sponge and dried in isopropyl alcohol (IPA) vapor. Five such treated substrates are prepared by the above series of steps and subjected to evaluation by carrying out the following processes 1 and 2 in order. The evaluation methods will be described hereinafter. The light absorption coefficients of the substrates used in this Example at 146 nm and 172 nm are higher than 10/cm (about 1,000/cm as estimated by extrapolation) and 0.01/cm, respectively.

Process 1: Light Beam Application

A substrate 1 is set in a process chamber 20 of a light beam application apparatus shown in FIG. 5. The process chamber 20 is filled with gas ($N_2/O_2$) and a light beam is applied from a light source 11 installed in a lamp house 10 through a window 11 under the following conditions.

Dielectric barrier discharge lamp filled with $Xe_2$ gas (dominant wavelength: 172 nm)

Illuminance at the window wall 30: 10 mW/cm$^2$

Gas ($N_2/O_2$)=95/5 vol %

Exposure time: 5 min (application amount: 3 J/cm$^2$)

Surface potential: −2 mV (at a pH of 3.1)

Process 2: Spin Method

Figure 6:
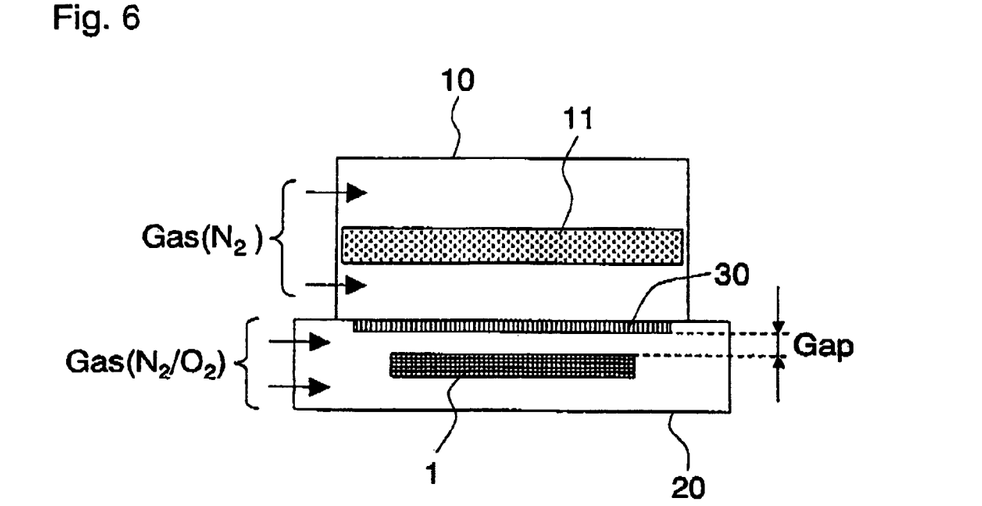
FIG. 6 is a view schematically illustrating one example of a light beam application apparatus used in Examples.
Figure 7:
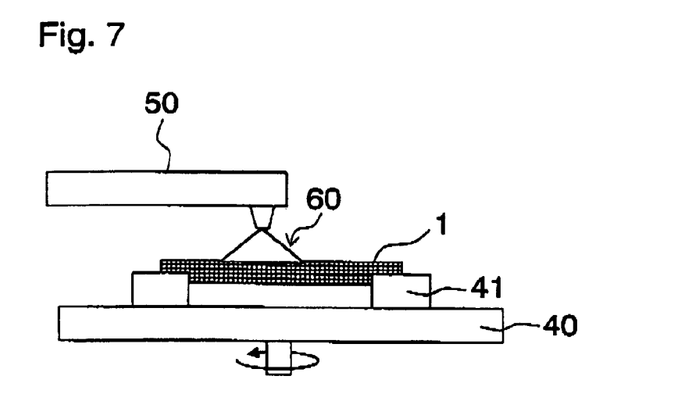
FIG. 7 is a side view illustrating a single cleaning equipment used in Examples.
Figure 8:
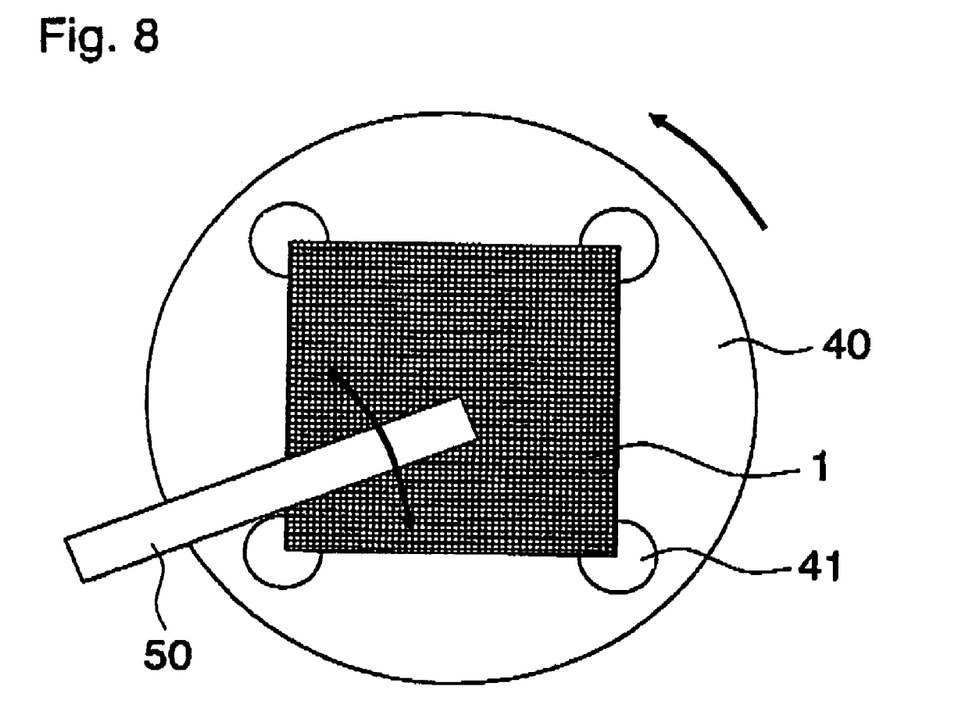
FIG. 8 is a plan view illustrating the single cleaning equipment shown in FIG. 7.

The substrate 1 is set on a rotatable base 40 of a single cleaning apparatus (such as ASC5500 manufactured by Hamatech) as shown in FIGS. 6 and 7 by means of a substrate chuck 41 so that the surface irradiated with the light beam in process 1 faces upside. An acidic solution or alkali solution 60 is supplied to the surface of the substrate 1 from a nozzle 50 while rotating the base 40 to carry out the spin method under the following conditions. The nozzle 50 can swivel, whereby the chemical solution can be uniformly supplied to the entire is surface of the substrate 1.

Spinning method (acid solution): 0.8 wt % HF aqueous solution (room temperature: pH=1), 50 rpm×5 min Rinsing: Deionized water (room temperature), 150 rpm×3 min Spin drying: 1,200 rpm×1 min Evaluation Method The following evaluations 1 and 2 are carried out with respect to the substrate surface before and after the processes 1 and 2.

Evaluation 1: Defect Test

A substrate is set to a defect inspection apparatus (such as M1350 manufactured by Lasertec Corporation) and inspected for foreign matters with sizes of at least 60 μm as calculated as polystyrene latex (PSL) particles in an area (142×142 mm square) at the center of the substrate. The coordinates of the foreign matters detected by the test before and after the processes 1 and 2 are compared to determine the number of foreign matters which are not removed by the spin method and the number of foreign matters which are newly attached by the spin method in accordance with the following manner.

Number of foreign matters which are not removed by the spin method: the number of foreign matters detected at the same positions (positions with a distance within 20 μm) in the substrate by the test before and after the processes 1 and 2.

The number of foreign maters which are newly attached by the spin method: the number of foreign matters which are not detected by the test before the processes 1 and 2 but detected only by the test after the processes 1 and 2.

Evaluation 2: Measurement of Surface Roughness

The surface roughness (RMS) in the above area at the center of the substrate is measured after the processes 1 and 2 by using an atomic force microscope (Dimension series manufactured by Veeco Instruments).

The results of the evaluations 1 and 2 are shown in the following Table.

Example 2 (Comparative Example)

The same treatment as in Example 1 is carried out except that the lamp application conditions in process 1 and the conditions of the spin method in process 2 are changed to the following conditions, and evaluations are carried out in the same manner as in Example 1. The results of the evaluations 1 and 2 are shown in the following Table.

(Process 1)

Dielectric barrier discharge lamp filled with $Xe_2$ gas (dominant wavelength: 172 nm)

Luminance at the window wall 30: 10 mW/cm$^2$

Gas ($N_2/O_2$): 95/5 vol %.

Exposure time: 5 min (application amount: 3 J/cm$^2$)

Surface potential: −2 mV (at a pH of 3.1)

(Process 2)
  Spin method (acidic solution): 0.1 wt % HF aqueous solution (room temperature, pH=2), 50 rpm×5 min
  Rinsing: Deionized water (room temperature), 150 rpm×3 min
  Spin drying: 1,200 rpm×1 min Example 3

The same treatment as in Example 1 is carried out except that the lamp application conditions in process 1 and the conditions of the spin method in process 2 are changed to the following conditions, and evaluations are carried out in the same manner as in Example 1. The results of the evaluations 1 and 2 are shown in the following Table.
(Process 1)
  Dielectric barrier discharge lamp filled with $Xe_2$ gas (dominant wavelength: 172 nm)
  Luminance at the window wall 30: 10 mW/cm$^2$
  Gas ($N_2/O_2$): 99.9/0.1 vol %
  Exposure time; 30 min (application amount: 18 J/cm$^2$)
  Surface potential: −15 mV (at a pH of 3.1)
(Process 2)
  Spin method (acidic solution): 0.1 wt % HP aqueous solution (room temperature, pH=2), 50 rpm×5 min
  Rinsing: Deionized water (room temperature), 150 rpm×3 min
  Spin drying: 1,200 rpm×1 min Example 4

The same treatment as in Example 1 is carried out except that the lamp application conditions in process 1 and the conditions of the spin method in process 2 are changed to the following conditions, and evaluations are carried out in the same manner as in Example 1. The results of the evaluations 1 and 2 are shown in the following Table.
(Process 1)
  Dielectric barrier discharge lamp filled with Kr gas (dominant wavelength: 146 nm) Luminance at the window wall 30: 5 mW/cm$^2$
  Gas ($N_2/O_2$): 99.9/0.1 vol %
  Exposure time: 5 min (application amount: 1.5 J/cm$^2$)
  Surface potential: −30 mV (at a pH of 3.1)
(Process 2)
  Spin method (acidic solution): 0.1 wt % HF aqueous solution (room temperature, pH=2), 50 rpm×5 min
  Rinsing: Deionized water (room temperature), 150 rpm×3 min
  Spin drying: 1,200 rpm×1 min Example 5

The same treatment as in Example 1 is carried out except that the lamp application conditions in process 1 and the conditions of the spin method in process 2 are changed to the following conditions, and evaluations are carried out in the same manner as in Example 1. The is results of the evaluations 1 and 2 are shown in the following Table.
(Process 1)
  Dielectric barrier discharge lamp filled with Kr gas (dominant wavelength: 146 nm)
  Luminance at the window wall 30: 5 mW/cm$^2$
  Gas ($N_2/O_2$): 95/5 volt
  Exposure time: 15 min (application amount: 4.5 J/cm$^2$)
  Surface potential: −50 mV (at a pH of 3.1)

(Process 2)
  Spin method (acidic solution): 0.1 wt % HF aqueous solution (room temperature, pH=2), 50 rpm×5 min
  Rinsing: Deionized water (room temperature), 150 rpm×3 min
  Spin method (alkali solution): 1 wt % ammonia aqueous solution (room temperature)
  Ultrasonic waves at 1 MHz applied at the time of supply 50 rpm×4 min
  Rinsing: Deionized water (room temperature), 150 rpm×3 min
  Spin drying: 1,200 rpm×min

TABLE 1

|  | Ex. 1 | Ex. 2 | Ex. 3 | Ex. 4 | Ex. 5 |
| --- | --- | --- | --- | --- | --- |
| Number of defects before processes | 600 | 610 | 650 | 600 | 600 |
| Number of defects not removed by spin method | 15 | 50 | 12 | 9 | 11 |
| Number of defects newly attached by spin method | 8 | 10 | 9 | 9 | 1 |
| Surface roughness (RMS) after processes (Å) | 1.6 | 1.2 | 1.2 | 1.2 | 1.2 |

As evident from Table 1, the foreign matters can be effectively removed while the increase of the surface roughness is suppressed to such an extent that the increase is not problematic (surface roughness (RMS) after cleaning less than 1.5 Å), and substantially no foreign matters are newly attached by the treatment, on the substrates (Examples 3 to 5) treated by the method of the present invention as compared with Comparative Examples (Examples 1 and 2).

Further, an EUV mask blank is formed by using each of the substrates in Examples 3 to 5. With such an EUV mask blank, no defects resulting from the blank occurs, and sufficient exposure is possible.

The invention claimed is:

1. A method for removing inorganic foreign matters from a surface of a substrate made of silicon or glass or a surface of an inorganic coating formed on the substrate, comprising:
   providing the substrate in an oxygen- or ozone-containing atmosphere having an oxygen concentration or an ozone concentration sufficient to generate uncrosslinked oxygen radicals on the surface of the substrate or the surface of the inorganic coating with irradiation of a light beam;
   applying to the surface of the substrate or to the surface of the inorganic coating a light beam in a wavelength range which makes a light absorption coefficient of at least one of a material of the substrate, a material of the inorganic coating and the inorganic foreign matters be at least 0.01/cm in an application amount of at least 10 J/cm$^2$ in the oxygen -or ozone-containing atmosphere, wherein the application of the light beam generates uncrosslinked oxygen radicals on the surface of the substrate or the surface of the inorganic coating; and
   exposing the surface of the substrate or the surface of the inorganic coating to an acidic solution having a pH $\leqq 6$ after the applying of the light beam such that the surface of the substrate or the surface of the inorganic coating has a negative surface potential.

2. A method for removing inorganic foreign matters from a surface of a substrate made of silicon or glass or a surface of an inorganic coating formed on the substrate, comprising:
   providing the substrate in an oxygen- or ozone-containing atmosphere having an oxygen concentration or an ozone concentration sufficient to generate uncrosslinked oxygen radicals on the surface of the substrate or the surface of the inorganic coating with irradiation of a light beam;

applying to the surface of the substrate or to the surface of the inorganic coating a light beam in a wavelength range which makes a light absorption coefficient of at least one of a material of the substrate, a material of the inorganic coating and the inorganic foreign matters be at least 1/cm in an application amount of at least 1 J/cm$^2$ in the oxygen- or ozone-containing atmosphere, wherein the application of the light beam generates uncrosslinked oxygen radicals on the surface of the substrate or the surface of the inorganic coating; and exposing the surface of the substrate or the surface of the inorganic coating having a negative surface potential to an acidic solution having a pH $\leqq 6$ after the applying of the light beam such that the surface of the substrate or the surface of the inorganic coating has a negative surface potential.

3. The method for removing inorganic foreign matters according to claim 1 or 2, wherein the surface of the substrate or the surface of the inorganic coating is treated with an aqueous solution or water vapor after application of the light beam.

4. The method for removing inorganic foreign matters according to claim 1, wherein, at exposure to the acidic solution having a pH $\leqq 6$, a surface voltage of the surface of the substrate or the surface of the inorganic coating is at most $-10$ mV.

5. The method for removing inorganic foreign matters according to claim 1, wherein, after exposure to the acidic solution having a pH $\leqq 6$, the surface of the substrate or the surface of the inorganic coating is exposed to an alkali solution having a pH of from 8 to 12 to remove organic foreign matters from the surface of the substrate or the surface of the inorganic coating formed on the surface of the substrate.

6. The method for removing inorganic foreign matters according to claim 1, wherein a wavelength of the light beam is at most 400 nm.

7. The method for removing inorganic foreign matters according to claim 1, wherein a wavelength of the light beam is at most 180 nm, and the oxygen concentration or the ozone concentration in the oxygen- or ozone- containing atmosphere is at most 10 vol %.

8. The method for removing inorganic foreign matters according to claim 1, wherein a wavelength of the light beam exceeds 180 nm and is at most 400 nm, and the oxygen concentration or the ozone concentration in the oxygen- or ozone-containing atmosphere is at least 0.1 vol % and at most 50 vol %.

9. The method for removing inorganic foreign matters according to claim 1, wherein, in the oxygen- or ozone-containing atmosphere, a total concentration of H$_2$ and H$_2$O is at most 1 vol %.

10. The method for removing inorganic foreign matters according to claim 1, wherein the substrate is a substrate for a reflective mask blank for EUV lithography.

11. The method for removing inorganic foreign matters according to claim 1, wherein a surface roughness of the substrate is at most 1.5 Å.

12. The method for removing inorganic foreign matters according to claim 2, wherein, at exposure to the acidic solution having a pH $\leqq 6$, a surface voltage of the surface of the substrate or the surface of the inorganic coating is at most $-10$ mV.

13. The method for removing inorganic foreign matters according to claim 2, wherein, after exposure to the acidic solution having a pH $\leqq 6$, the surface of the substrate or the surface of the inorganic coating is exposed to an alkali solution having a pH of from 8 to 12 to remove organic foreign matters from the surface of the substrate or the surface of the inorganic coating formed on the surface of the substrate.

14. The method for removing inorganic foreign matters according to claim 2, wherein a wavelength of the light beam is at most 400 nm.

15. The method for removing inorganic foreign matters according to claim 2, wherein a wavelength of the light beam is at most 180 nm, and the oxygen concentration or the ozone concentration in the oxygen- or ozone- containing atmosphere is at most 10 vol %.

16. The method for removing inorganic foreign matters according to claim 2, wherein a wavelength of the light beam exceeds 180 nm and is at most 400 nm, and the oxygen concentration or the ozone concentration in the oxygen- or ozone-containing atmosphere is at least 0.1 vol % and at most 50 vol %.

17. The method for removing inorganic foreign matters according to claim 2, wherein, in the oxygen- or ozone-containing atmosphere, a total concentration of H$_2$ and H$_2$O is at most 1 vol %.

18. The method for removing inorganic foreign matters according to claim 2, wherein the substrate is a substrate for a reflective mask blank for EUV lithography.

19. The method for removing inorganic foreign matters according to claim 2, wherein a surface roughness of the substrate is at most 1.5 Å.

* * * * *